United States Patent
Park

(10) Patent No.: US 9,613,681 B2
(45) Date of Patent: Apr. 4, 2017

(54) VOLTAGE GENERATION CIRCUIT

(71) Applicant: SK hynix Inc., Gyeonggi-do (KR)

(72) Inventor: Hyun Kyu Park, Chungcheongnam-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/056,600

(22) Filed: Feb. 29, 2016

(65) Prior Publication Data

US 2017/0069370 A1    Mar. 9, 2017

(30) Foreign Application Priority Data

Sep. 7, 2015  (KR) .................. 10-2015-0126381

(51) Int. Cl.
G11C 5/14     (2006.01)
G11C 11/4099  (2006.01)
G05F 3/24     (2006.01)
G05F 3/16     (2006.01)

(52) U.S. Cl.
CPC ............ *G11C 11/4099* (2013.01); *G05F 3/16* (2013.01); *G05F 3/242* (2013.01); *G05F 3/247* (2013.01)

(58) Field of Classification Search
CPC ....................................................... G05F 3/16
USPC ...................................... 365/189.09; 327/543
See application file for complete search history.

(56) References Cited

U.S. PATENT DOCUMENTS

| | | | | |
|---|---|---|---|---|
| 7,990,778 B2* | 8/2011 | Oku | ................. | G11C 5/145 365/189.09 |
| 8,212,544 B2* | 7/2012 | Kang | ................. | G05F 1/575 323/313 |
| 9,361,969 B2* | 6/2016 | Kim | ................. | G11C 11/40626 |
| 2014/0368180 A1* | 12/2014 | Ok | ................. | G05F 3/262 323/315 |
| 2016/0085249 A1* | 3/2016 | Lim | ................. | G11C 16/30 365/185.18 |

FOREIGN PATENT DOCUMENTS

KR       100885489       2/2009
KR     1020130046519     5/2013

* cited by examiner

*Primary Examiner* — Son Mai
(74) *Attorney, Agent, or Firm* — IP & T Group LLP

(57) ABSTRACT

A voltage generation circuit may include: a main code table suitable for outputting a main code based on an operation signal; a main voltage generator suitable for generating a main voltage corresponding to the main code; a trimming module suitable for comparing the main voltage with a target voltage to output a trimming signal; a trimming code table suitable for outputting a trimming code corresponding to the trimming signal; a code determination module suitable for outputting the main code and the trimming code when the trimming code is determined to be valid, and outputting the main code and a output code when the trimming code is determined to be invalid; and an operation voltage generator suitable for outputting an operation voltage based on the main code and a code selected from the trimming code and the substitute code.

16 Claims, 8 Drawing Sheets

VOLTAGE GENERATION CIRCUIT

CROSS-REFERENCE TO RELATED APPLICATION

The present application claims a priority to a Korean patent application number 10-2015-0126381 filed on Sep. 7, 2015, the entire disclosure of which is incorporated herein in its entirety by reference.

BACKGROUND

Field of Invention

Various embodiments of the present disclosure relate generally to semiconductor technology, and more particularly to a voltage generation circuit having an overvoltage prevention feature for a memory device.

Description of Related Arts

Memory devices may include a memory cell array for storing data, a peripheral circuit suitable for performing programming (also referred to as writing operation), reading and erasing operations on the memory cell array, and a control circuit suitable for controlling the peripheral circuit.

The peripheral circuit includes a voltage generation circuit to generate one or more operation voltages for performing the various memory operations.

General, a typical voltage generation circuit may include code tables employed to generate different level operation voltages. For example, a main code table may be used to generate a main voltage, and another table commonly referred to as a trimming code table may be used to trim the main voltage.

A trimming code table may include a variety of codes used to compensate for variations of the main voltage. An abnormal code may be generated from the voltage generation circuit when an operation voltage is outside of an available voltage range. In such a case, the voltage generation circuit may generate an overvoltage as the operation voltage, subjecting the generation circuit, the peripheral circuit and the memory cell array to increased stress. Repeated increased stresses due to overvoltage may degrade the performance of a memory device and associated system.

SUMMARY

Various embodiments of the present disclosure are directed to a voltage generation circuit having an overvoltage prevention feature, a memory system including the same, and a method of operation thereof.

In one aspect of the present disclosure, there is provided a voltage generation circuit comprising: a main code table suitable for outputting a main code based on an operation signal; a main voltage generator suitable for generating a main voltage corresponding to the main code; a trimming module suitable for comparing the main voltage with a target voltage to output a trimming signal; a trimming code table suitable for outputting a trimming code corresponding to the trimming signal; a code determination module suitable for outputting the main code and the trimming code when the trimming code is determined to be valid, and outputting the main code and a output code when the trimming code is determined to be invalid; and an operation voltage generator suitable for outputting an operation voltage based on the main code and a code selected from the trimming code and the substitute code.

In one aspect of the present disclosure, there is provided a memory system comprising: a memory device; and a controller suitable for controlling the memory device, wherein the memory device comprises: memory blocks suitable for storing data; a voltage generation circuit suitable for generating an operation voltage based on an operation signal; and a control circuit suitable for generating the operation signal to control the voltage generation circuit based on a command, wherein, when a trimming code is determined to be valid, the voltage generation circuit generates the operation voltage based on a main code and the trimming code, and when the trimming code is determined to be invalid, the voltage generation circuit generates the operation voltage based on the main code and a substitute code.

In one aspect of the present disclosure, there is provided an operating method of a memory system, comprising: outputting a main code based on an operation signal; generating a main voltage corresponding to the main code; comparing the main voltage with a target voltage to output a trimming signal; outputting a trimming code corresponding to the trimming signal; determining whether the trimming code is valid; outputting the main code and the trimming code when the trimming code is determined to be valid, and outputting the main code and a substitute code corresponding to the trimming code when the trimming code is determined to be invalid; and outputting an operation voltage based on the main code and a code selected from the trimming code and the substitute code.

In this approach, the overvoltage generation may be suppressed in the voltage generation circuit. Thus, the voltage generation circuit, the memory device including the generation circuit, and the memory system including the memory device all are subjected to a less stress. This may lead to a longer life span and an improved reliability of the memory device and the memory system.

DETAILED DESCRIPTIONS

Figure 1:
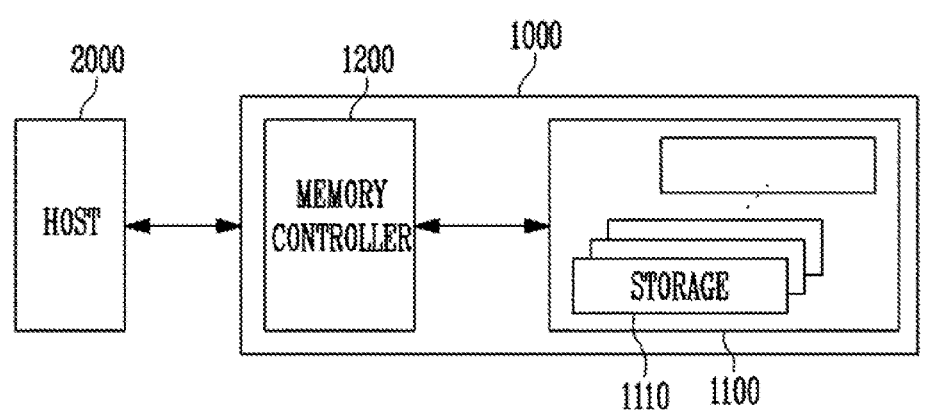
FIG. 1 is a block diagram illustrating a memory system, according to an embodiment of the present invention.

Various embodiments of the invention are described further below in reference to the accompanying drawings. It will be understood that the discussion herein is not intended to limit the invention to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or it can be indirectly connected to, or coupled to the other element or layer with one or more intervening elements or layers being present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. As used herein, the term "and/or" includes any and all combinations of one or more of the associated listed items Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all these specific details. In other instances, well-known process structures and/or processes have not been described in detail in order not to unnecessarily obscure the present disclosure.

Hereinafter, the various embodiments of the present disclosure will be described with reference to the drawings.

FIG. 1 is a block diagram illustrating a memory system, according to an embodiment of the present invention.

Referring to FIG. 1, a memory system 1000, according to an embodiment of the invention may include a memory device 1100 suitable for storing data therein and a memory controller 1200 suitable for controlling the memory device 1100.

The memory device 1100 may include a plurality of data storage device devices 1110s. Each data storage device 1110 maybe or comprise a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power Double Data Rate (LPDDR) SDRAM, a Rambus Dynamic Random Access Memory (RDRAM), a flash memory, and the like. Hereinafter, for example, data storage device devices (i.e., unit memory devices) 1110s including a NAND flash memory are described.

The memory controller 1200 may control all operations of the memory device 1100. The memory controller 1200, in response to a command from a host 2000, may output or send a command address and data to control the memory device 1100 to the memory device 1100 or receive data from the memory device 1100.

The host 2000 may communicate with the memory system 1000 via an interface protocol such as a Peripheral Component Interconnect-Express (PCI-E), an Advanced Technology Attachment (ATA), a Serial ATA (SATA), a Parallel ATA (PATA), a Serial Attached SCSI (SAS), or the like.

Figure 2:
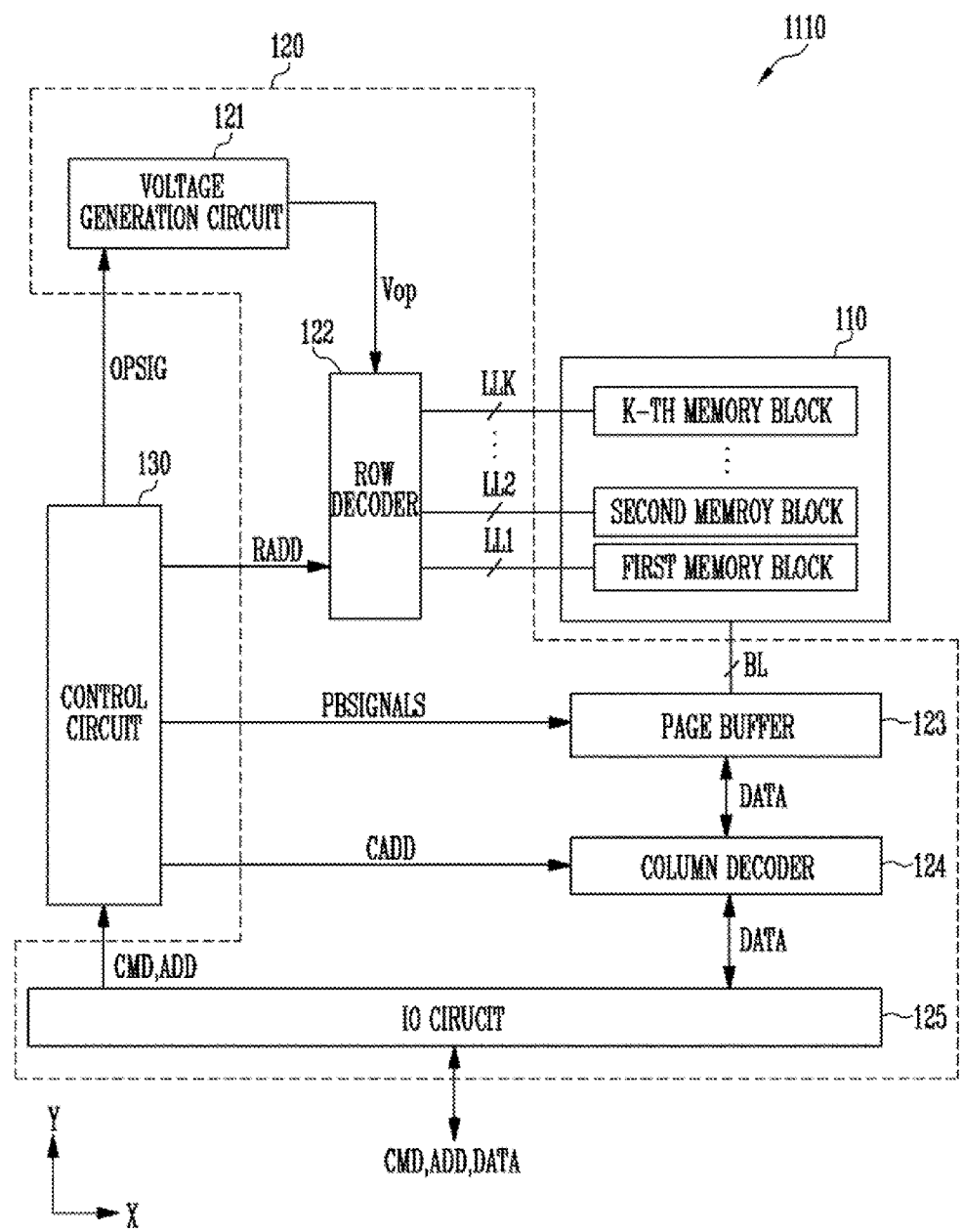
FIG. 2 is a diagram illustrating a memory device, according to an embodiment of the present invention.

FIG. 2 is a diagram illustrating a memory device, according to an embodiment of the present invention.

Referring to FIG. 2, a storage device 1110 may include a memory cell array 110 suitable for storing data therein, a peripheral circuit 120 suitable for performing a programming, reading or erasing operation for the memory cell array 110, and a control circuit 130 suitable for controlling the peripheral circuit 120.

The memory cell array 110 may include first to K-th memory blocks, where K is a positive integer. The memory blocks may have the same configuration. The memory blocks may have a two-dimensional or three-dimensional structure. Each memory block may be coupled to a row decoder 122 via a local line LL1 to LLK.

The peripheral circuit 120 may include a voltage generation circuit 121, a row decoder 122, a page buffer 123, a column decoder 124 and an input/output circuit 125.

The voltage generation circuit 121 may generate a different level operation voltage Vop in response to an operation signal OPSIG. For example, upon a receipt of a programming operation signal OPSIG, the voltage generation circuit 121 may generate a programming voltage for a programming operation, a programming pass voltage, and a programming verification voltage. Upon receipt of a reading operation signal OPSIG, the voltage generation circuit 121 may generate a reading voltage for a reading operation and a reading pass voltage. Upon receipt of an erasing operation signal OPSIG, the voltage generation circuit 121 may generate an erasing voltage for an erasing operation and an erasing verification voltage.

It is noted that the voltage generation circuit 121 may be configured to prevent generating an overvoltage as an operation voltage Vop via trimming of a main voltage.

The row decoder 122 may deliver an operation voltage Vop to a selected local line, for example local line LL1. The local line may be selected according to a row address RADD provided by a control unit 130 via row decoder 122.

The page buffer 123 may be connected via bit-lines BL to the memory cell array 110, and may pre-charge the bit-lines BL in a positive voltage in response to receiving a page buffer control signal PBSIGNALS. The page buffer 123 may exchange data to and from a selected memory block, for example in a programming or reading operation. The page buffer 123 may store temporarily received data.

The column decoder 124 may communicate data DATA with the page buffer 123 according to a column address CADD. The column decoder 124 may communicate data DATA with the input/output circuit 125.

The input/output circuit 125 may deliver a command CMD and an address ADD from an external device (for example, the memory controller) to the control circuit 130. The input/output circuit 125 may output data DATA from an external device to the column decoder 124. The input/output circuit 125 may output data DATA from the column decoder 124 to the external device.

The control circuit 130 may control the peripheral circuit 120 in response to a command CMD and address ADD.

The first to K-th memory blocks may be implemented in a two-dimensional or three-dimensional structure.

Figure 3:
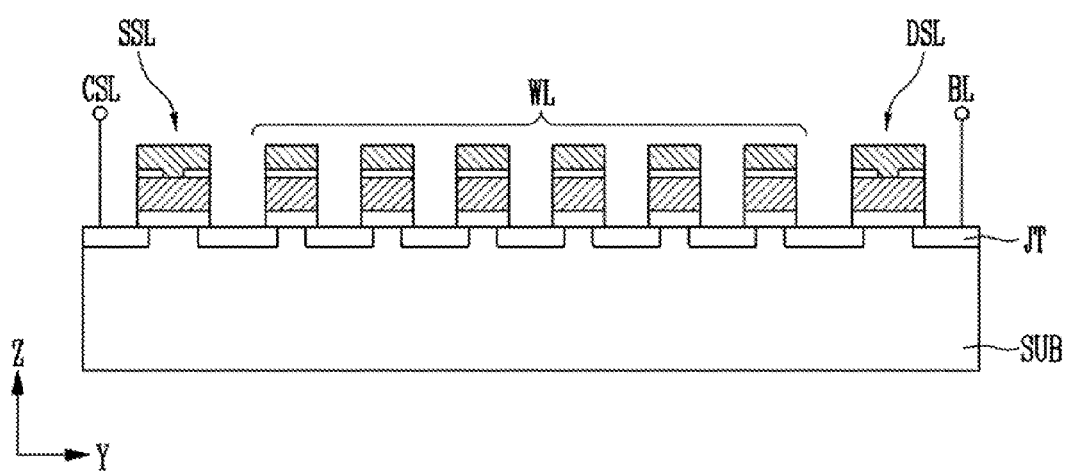
FIG. 3 is a cross-sectional view of a two-dimensional structure of a memory block employed in a memory device, according to an embodiment of the present invention.

FIG. 3 is a cross-sectional view of a two-dimensional structure of a memory block, wherein the two-dimensional structure may be horizontally formed in a Y-direction on a substrate SUB. The memory block may include a string between a bit-line BL and a common source line CSL. The string may include a source select transistor, the memory cells and a drain select transistor. Between the source select transistor, and the memory cells, between the memory cells and between the drain select transistor and the memory cells, there may be formed respective junctions 3T in the substrate SUB.

The source select transistor may have a gate coupled to a source select line SSL, and the memory cells each may have each gate coupled to each of word-lines WL, and the drain select transistor may have a gate coupled to a drain select line DSL. A drain junction JT of the drain select line may be coupled to the bit-line BL, while a source junction JT of the source select line may be coupled to the common source line CSL.

For example, each of the source select transistor, the memory cells and the drain select transistor may include a stack of a vertical (i.e., in a Z-direction) arrangement comprising a tunnel insulating film, a floating gate, a dielectric film and a control gate in this order on and from the substrate SUB. A tunnel insulating film may be made of an oxide film. A floating gate and a control gate may be made of a doped poly-silicon film. A dielectric film may comprise one or more layers of an oxide film, a nitride film and an oxide film. For example, a dielectric film may be made of a stack having oxide film, a nitride film and an oxide film, also referred to hereinafter as an ONO stack). A dielectric film may comprise a high-k dielectric film. Each dielectric film may be partially removed from a corresponding source select and drain select transistor so that each floating gate and each control gate may partially contact with each other. Each memory cell coupled to each word-line WL may have each floating gates and each control gates separated from each other via each dielectric films.

Figure 4:
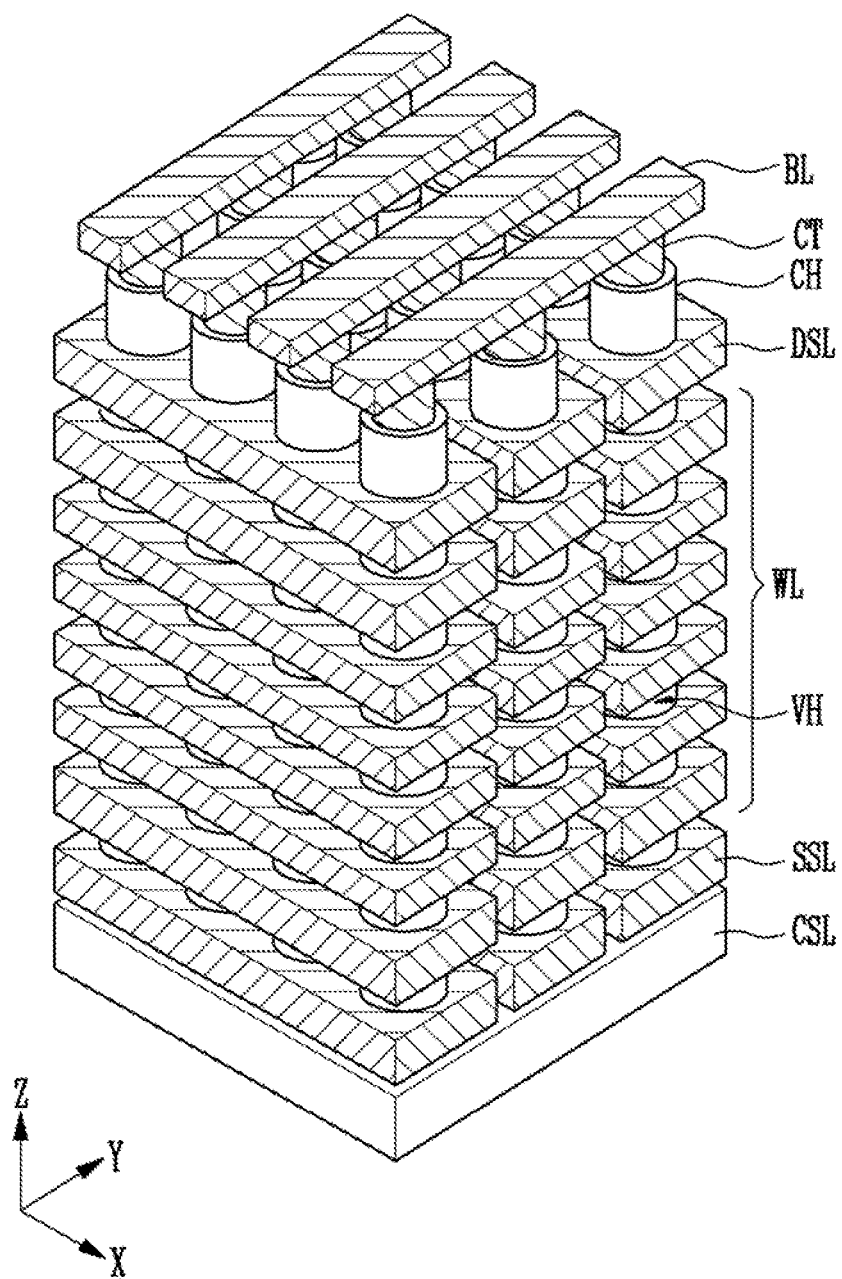
FIG. 4 is a perspective view of a three-dimensional structure of a memory block employed in a memory device, according to an embodiment of the present invention.

FIG. 4 is a perspective view of a three-dimensional structure of a memory block employed in a memory device, according to an embodiment of the present invention.

Referring to FIG. 4, a three-dimensional structure of a memory block may be vertically formed in a Z-direction on a substrate and may include a horizontal arrangement of vertical strings, each string disposed between each of the bit-lines BL and a common source line CSL. This structure may be referred to as Bit Cost Scalable (BiCS). For example, the common source line CSL may be formed horizontally on the substrate, and in this case, each string having the BiCS structure may extend vertically upwards from the common source line CSL. For example, the strings may be arranged in a first direction, for example a Y-direction, and each string may include a stack of each of the source lines SSL, the word-lines WL and each of the drain select lines DSL, all which are spaced from each other. Each string may include vertical through-holes VH, each hole passing through a corresponding source line SSL, corresponding word-lines WL and a corresponding drain select line DSL. Each vertical through-hole VH may be filled with a conductive material to form a channel pillar CH therein. Each pillar may contact the common source line CSL. Each bit-line BL may extend in a Y-direction and may contact a plurality of channel pillars CH at the top of each pillar extending above the drain select lines DSL. The bit-lines BL may be arranged in a second direction, for example in an X-direction perpendicular to the Y-direction. Between each bit-line BL and each channel pillar CH, there may be formed a contact plug CT.

Figure 5:
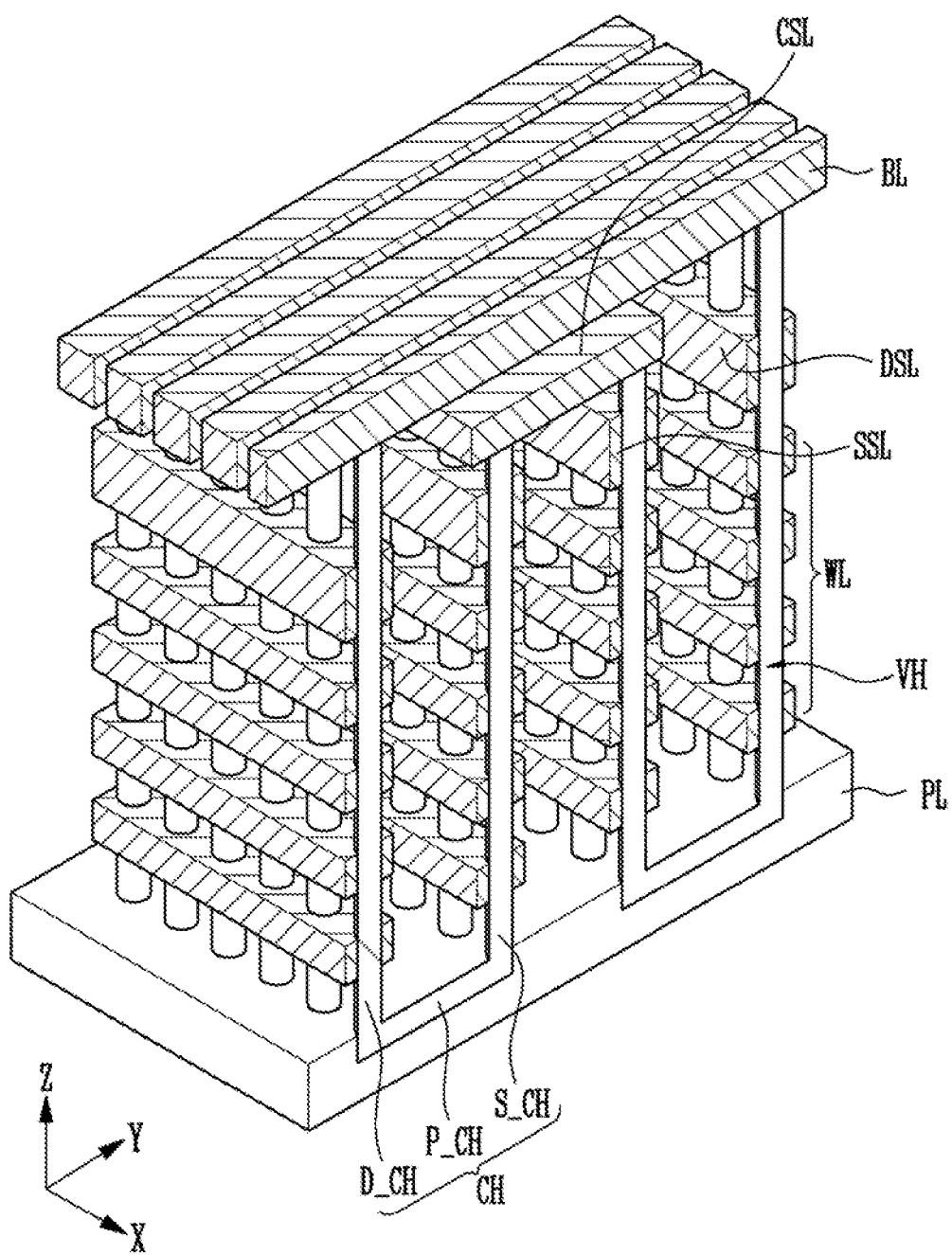
FIG. 5 is a perspective view of another three-dimensional structure of a memory block employed in a memory device, according to an embodiment of the present invention.

FIG. 5 is a perspective view of another example of a three-dimensional structure of the memory block shown in FIG. 2.

Referring to FIG. 5, a three-dimensional structure of the memory block may be formed vertically, for example in a Z-direction on a substrate, and include a plurality of strings between each of bit-lines BL and a common source line CSL and each of pipe structures, each pipe structure connecting two strings.

For example, each string may be configured so that a first sub-string may vertically extend between a bit-line BL and a pipe line PL, a second sub-string may vertically extend between the common source line CSL and the pipe line PL, and the first and second sub-strings may be connected via the pipe line PL. This structure may be referred to as Pipe-shaped Bit Cost Scalable (P-BiCS).

For example, the pipe line PL may be horizontally formed on the substrate. In this case, each of the strings having the P-BiCS structure may include a first sub-string vertically extending between the bit-line BL and the pipe line PL, and a second sub-string vertically extending between the common source line CSL and the pipe line PL.

The first sub-strings may be arranged in a first direction Y DIRECTION. Each first sub-string may include a vertical spaced-arrangement of the word-lines WL, each of drain select lines DSL and each of first channel pillars D_CH. The pillar may fill the vertical through-hole VH passing through the word-lines WL and the drain select line DSL. The first sub-strings may be arranged in the first direction. The second sub-strings may be arranged in the first direction. Each second sub-string may include a vertical spaced-arrangement of the word-lines WL, each of source select lines SSL and each of second channel pillars S_CH. The pillar S_CH may fill the vertical through-hole VH passing through the word-lines WL and the source select line SSL.

The first channel pillar D_CH and second channel pillar S_CH may be connected to each other via each of the pipe channel pillars P_CH formed in the pipe line PL. Each of the bit-lines BL may contact a top of each of the first channel pillars D_CH, each top vertically extending upwards from each of the drain select lines DSL. The bit-lines BL may be arranged in the first direction, while each bit-line may extend in a second direction perpendicular to the first direction.

Figure 6:
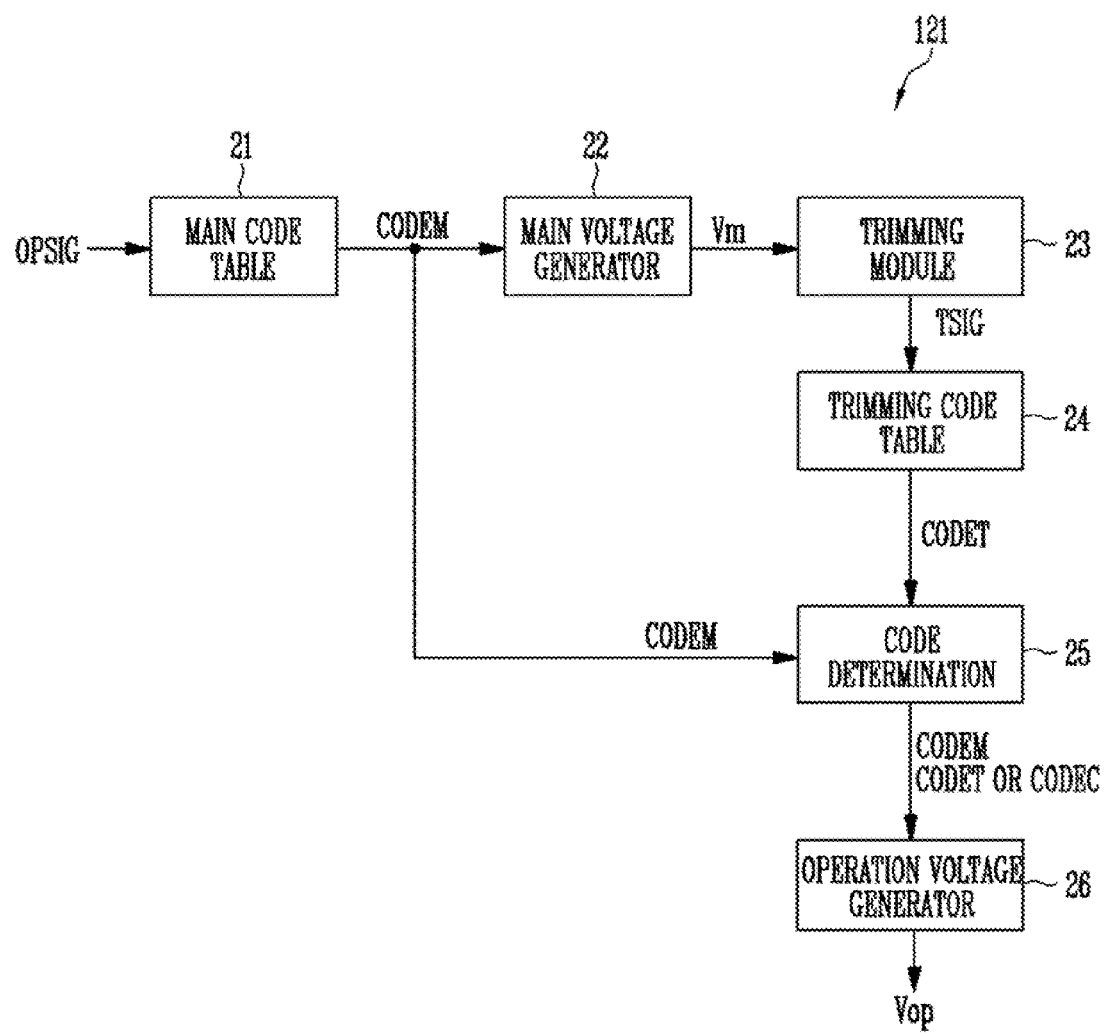
FIG. 6 is a diagram illustrating a voltage generation circuit shown employed in a memory device, according to an embodiment of the present invention.

FIG. 6 is a diagram illustrating a voltage generation circuit shown employed in a memory device, according to an embodiment of the present invention.

Referring to FIG. 6, a voltage generation circuit 121 may include a main code table 21, a main voltage generator 22, a trimming module 23, a trimming code table 24, a code determination module 25 and an operation voltage generator 26.

The main code table 21 may store therein a variety of main codes for generation of a main voltage. Upon a receipt of an operation signal OPSIG, the main code table 21 may output a main code CODEM corresponding to the operation signal OPSIG among the main codes.

The main voltage generator 22 may generate a main voltage Vm in response to the outputted main code CODEM.

The trimming module 23 may be suitable for outputting a trimming signal TSIG to reduce an error of the generated main voltage Vm. For example, the trimming module 23 may compare the main voltage Vm to a target voltage, to calculate a difference between the main voltage Vm and target voltage, and to output a trimming signal TSIG based on the difference.

The trimming code table 24 may store a variety of trimming codes to correct the main voltage Vm. Upon a receipt of the trimming signal TSIG, the trimming code table 24 may output a trimming code CODET corresponding to the trimming signal TSIG among the trimming codes.

The code determination module 25 may store output codes CODEC corresponding respectively to available output voltages. Further, the code determination module 25 may compare the trimming code CODET and the output codes CODEC, and output the main code CODEM and one of the trimming code CODET or the output codes CODEC. For example, when the received trimming code CODET coincides with one of the output codes CODEC, the code determination module 25 may output the main code CODEM and the received trimming code CODET. Otherwise, when the received trimming code CODET does not coincide with any one of the output codes CODEC, the code determination module 25 may output the main code CODEM and the most-significant output code as an output code CODEC, which corresponds to a maximum trimming voltage among the stored output codes CODEC. That is, the most-significant output code may be a substitute code for an invalid trimming code.

The operation voltage generator 26 may output an operation voltage Vop in response to the main code CODEM and the output code CODEC (i.e., either the trimming code CODET or the maximum output code CODEC), which are outputted from the code determination module 25. For example, the operation voltage Vop generated from the operation voltage generator 26 may be mainly determined based on the main code CODEM, and may be adjusted in response to the output code CODEC (i.e., either the trimming code CODET or the most-significant output code CODEC).

Although in FIG. 6, the main code table 21, the main voltage generator 22, the trimming module 23, the trimming code table 24 and the code determination module 25 all are incorporated into the voltage generation circuit 121, the present disclosure may not be limited thereto. For example, the main code table 21, main voltage generator 22, trimming module 23, trimming code table 24 and code determination module 25 may be incorporated into the control circuit 130 shown in FIG. 2. In this case, the control circuit 130 may generate the operation signal OPSIG, and then, in response to the operation signal OPSIG, the main code table 21, main voltage generator 22, trimming module 23, trimming code table 24 and code determination module 25 each may function in this order, to output the main code CODEM and the output code CODEC (i.e., either the trimming code CODET or the most-significant output code CODEC). The operation voltage generator 26 included in the voltage generation circuit 121 may output the operation voltage Vop in response to the main code CODEM and the output code CODEC (i.e., either the trimming code CODET or the most-significant output code CODEC), which are outputted from the control circuit 130.

Figure 7:
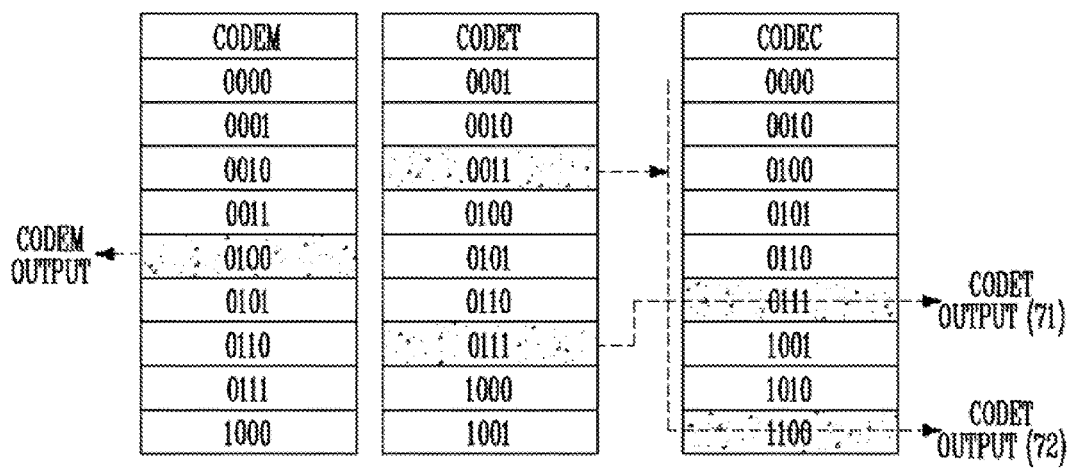
FIG. 7 is a diagram illustrating an example of a code table set, employed in a memory device, according to an embodiment of the present invention.

FIG. 7 is a diagram for describing an exemplary code table set.

Referring to FIG. 7, the main code table (21 in FIG. 6) may store therein main codes CODEM, the trimming code table (26 in FIG. 6) may store therein trimming codes CODET, and the code determination module (25 in FIG. 6) may store therein output codes CODEC. The codes CODEM, CODET and CODEC each may be formed of a multiple of bits. For example, the codes CODEM, CODET and CODEC each may be formed of 4 bits. The present disclosure may not be limited thereto. For example, depending on the storage device 1110, the codes CODEM, CODET and CODEC each may be formed of different bits from 4 bits.

A main code CODEM may be outputted from the main code table (21 in FIG. 6), and then, may reach the operation voltage generator (26 in FIG. 6).

A trimming code CODET may be outputted from the trimming code table (24 in FIG. 6), and then, may be outputted as unchanged from the code determination module (26 in FIG. 6) or, otherwise, may be replaced with an output code CODEC from the code determination module (26 in FIG. 6).

The output code CODEC may be outputted from the code determination module 25. When the trimming code CODET is outputted from the code determination module 25, the output code CODEC may not be outputted from the code determination module 25. In other words, the code determination module 25 may output the main code CODEM and the output code CODEC (i.e., either the most-significant output code CODEC or the trimming code CODET).

For example, when the main code table 21 may output '0100' of the main code CODEM, the '0100' of the main code CODEM may reach the operation voltage generator 26.

Assuming that the trimming code table 24 outputs '0111' of the trimming code CODET, the '0111' of the trimming code CODET may be delivered to the code determination module 25. When the '0111' of the trimming code CODET coincides with one of the output codes CODEC stored in the code determination module 25, the code determination module 25 may output the '0111' of the trimming code CODET (71).

Assuming that the trimming code table 24 outputs '0011' of the trimming code CODET, the '0011' of the trimming code CODET may be delivered to the code determination module 25. When the '0011' of the trimming code CODET does not coincide with any one of the output codes CODEC stored in the code determination module 25, the code determination module 25 may not output the '0011' of the trimming code CODET. Instead, the code determination module 25 may output a most-significant code among the output codes CODEC stored in the code determination module 25. The most-significant code may correspond to the maximum trimming voltage. For example, the most-significant code may correspond to '1100' (72). This may prevent the operation voltage generator (26 in FIG. 6) from outputting an overvoltage as an operation voltage.

The main code CODEM, trimming code CODET and output code CODEC as described above all as examples for facilitating understanding of the present disclosure, and thus, may vary depending on the memory device. For example, the main code CODEM, trimming code CODET and output code CODEC may be stored in different locations from the locations as mentioned above. For example, the codes may be stored in flag cells, spare cells or CAM cells in the memory blocks. When the codes are stored in different locations than the main code table 21, trimming code table 24 or code determination module 25, the codes may be read from associated locations and then, may be supplied to the main code table 21, trimming code table 24 or code determination module 25, respectively.

Figure 8:
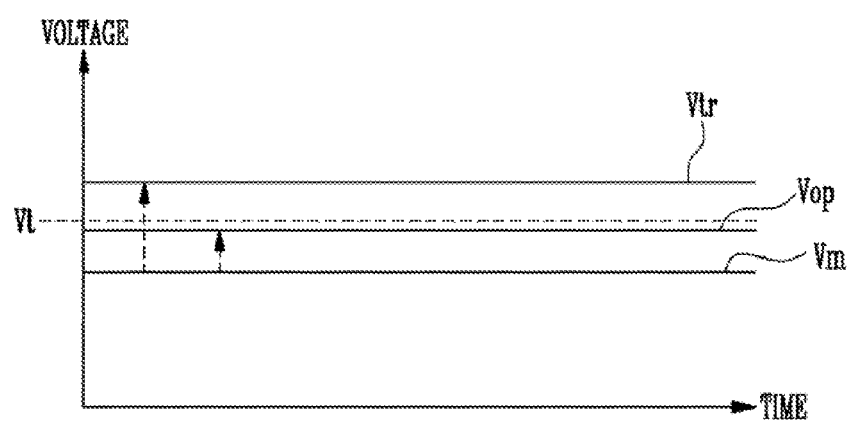
FIG. 8 is a graph illustrating a main voltage, an overvoltage and an operation voltage generated in a memory device, according to an embodiment of the present invention.

FIG. 8 is a graph showing examples of a main voltage, an overvoltage and an operation voltage. When a main voltage Vm outputted in response to the main code (CODEM in FIG. 6) may be lower than a target voltage Vt, the trimming module (23 in FIG. 6) may output the trimming signal TSIG that may be used to compensate the main voltage Vm. The trimming code table 24 may output the trimming code CODET in response to the trimming signal TSIG. When the trimming code CODET does not coincide with any one of output codes available from the voltage generation circuit (121 in FIG. 6), it may be possible that the operation voltage generator (26 in FIG. 6) may output an overvoltage Vtr above the target voltage Vt.

When the overvoltage Vtr is outputted, the storage device (1110 in FIG. 2) having the voltage generation circuit 121, and the memory system (1000 in FIG. 1) having the data storage device devices 1110s may be subjected to increased stress. For this reason, to prevent the operation voltage generator (26 in FIG. 6) from outputting the overvoltage Vtr above the target voltage Vt, the code determination module (25 in FIG. 6) may output the most-significant code (for example, '1100') among the output codes (CODEC in FIG. 7), where the most-significant code may correspond to the highest trimming voltage within a voltage range in which the data storage device devices 1110s may be subjected to a low level stress. In this way, the operation voltage generator (26 in FIG. 6) may output the operation voltage Vop below the overvoltage Vtr and proximate to the target voltage Vt.

This may prevent the data storage device devices 1110s from being subjected to an increased stress because of an overvoltage.

Figure 9:
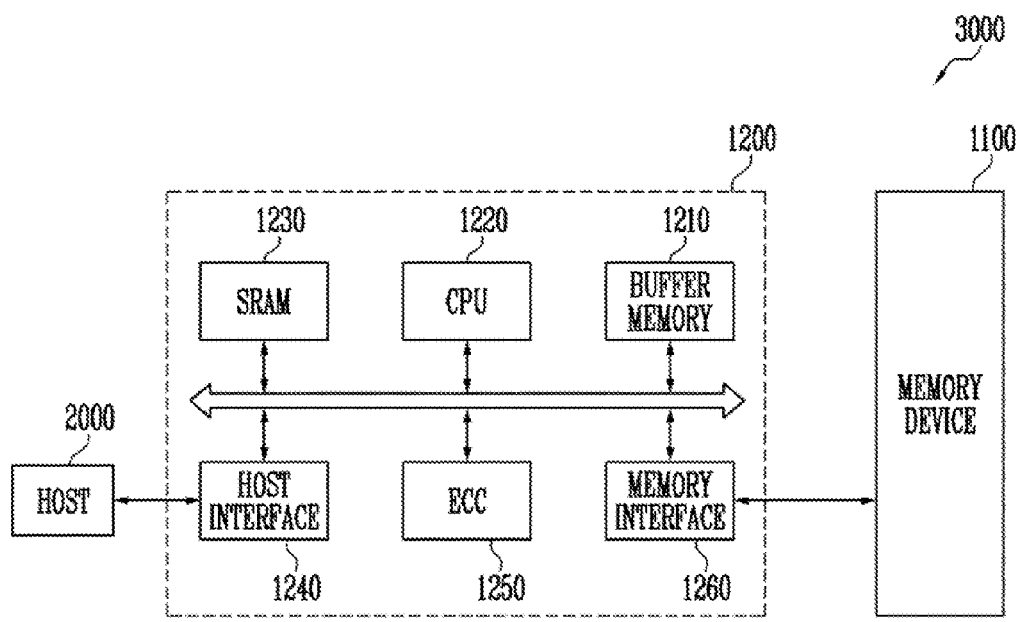
FIG. 9 is a block diagram illustrating a memory system, according to an embodiment of the present invention.

FIG. 9 is a block diagram illustrating a memory system, according to an embodiment of the present invention.

Referring to FIG. 9, a memory system 3000 according to an embodiment of the invention may include the memory device 1100 for storing data, and the memory controller 1200 for controlling the memory device 1100. The memory controller 1200 may control a communication between a host 2000 and the memory device 1100. The memory controller 1200 may include a buffer memory 1210, a Central Processing Unit (CPU) 1220, a Static Random Access Memory (SRAM) 1230, a host interface (I/F) 1240, an error correction code (ECC) module 1250 and the memory interface (I/F) 1260.

The buffer memory 1210 may temporarily store data while the memory controller 1200 may control the memory device 1100. The buffer memory 1210 may store main codes CODEM, trimming codes CODET and output codes CODEC for outputting a variety of voltages. The CPU 1220 may control data exchanges for the memory controller 1200. The CPU 1220 may compare and select the main codes CODEM, trimming codes CODET and output codes CODEC so that the memory device 1100 may generate the variety of voltages. For example, the CPU 1220 may determine that a trimming code used to correct the main voltage does not coincide with any output code corresponding to an available output voltage. In this case, the CPU 1220 may output a command to output an operation voltage in response to the most-significant code among the output codes.

The SRAM 1230 may act as a work memory for the CPU 1220. The host interface 1240 may have a data exchange protocol for a host 2000 coupled to the memory system 3000. The ECC module 1250 may detect and correct an error in data read from the memory device 1100. The memory interface 1260 may interface with the memory device 1100. Further, although not shown in the figure, the memory system 3000 may be provided with a Read Only Memory (ROM) (not shown) to store code data to interface with the host system or host 2000.

The host 2000 working together with the memory system 3000 may include a computer, Ultra Mobile PC (UMPC), workstation, net-book, Personal Digital Assistants (PDA), portable computer, web tablet, wireless phone, mobile phone, smart phone, e-book, portable multimedia player (PMP), portable game player, navigation device, black box, digital camera, 3-dimensional television, digital audio recorder, digital audio player, digital picture recorder, digital picture player, digital video recorder, digital video player, device with a wireless data communication, at least one electronic device forming home networking component, at least one electronic device forming computer networking component, at least one electronic device forming telematics networking component, at least one electronic device forming computing system component, or the like.

Figure 10:
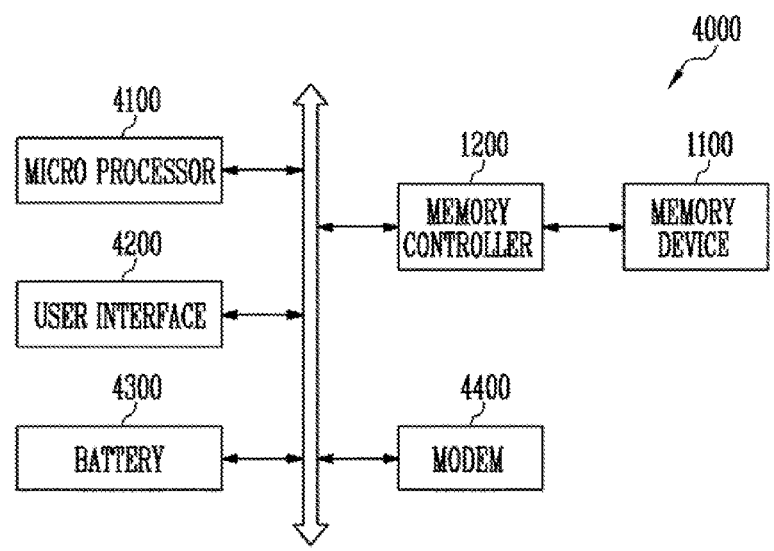
FIG. 10 is a block diagram illustrating a computing system, according to an embodiment of the present invention.

FIG. 10 is a block diagram illustrating a computing system according to an embodiment of the present disclosure.

Referring to FIG. 10, the computing system 4000 may include the memory device 1110, the memory controller 1200, a microprocessor 4100, a user interface 4200 and a modem 4400, all being electrically connected to each other via a system bus. When the computing system 4000 is implemented in a mobile device, the computing system 4000 may further include a battery (not shown) to supply an operation voltage thereof. The computing system 4000 may further include an application chipset, a camera image processor, a mobile DRAM, etc. The memory controller 1200 and the memory device 1110 may be configured to form a Solid State Drive/Disk (SSD).

The memory system 1200 and 1100 in the computing system 4000 may be packaged in various forms. For example, such packages may include Package on Package (PoP), Ball Grid Array (BGA), Chip Scale Package (CSP), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi-Chip Package (MCP), Wafer-level Fabricated Package (WFP), Wafer-Level Processed Stack Package (WSP), or the like.

The above description is not to be taken in a limiting sense. Many additional embodiments of this disclosure are possible without departing from the scope of the invention as defined by the appended Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language

What is claimed is:

1. A voltage generation circuit comprising:
   a main code table suitable for outputting a main code based on an operation signal;
   a main voltage generator suitable for generating a main voltage corresponding to the main code;
   a trimming module suitable for comparing the main voltage with a target voltage to output a trimming signal;
   a trimming code table suitable for outputting a trimming code corresponding to the trimming signal;
   a code determination module suitable for outputting the main code and the trimming code when the trimming code is determined to be valid, and outputting the main code and a output code when the trimming code is determined to be invalid; and
   an operation voltage generator suitable for outputting an operation voltage based on the main code and a code selected from the trimming code and the output code.

2. The circuit of claim 1, wherein the main code table stores a variety of main codes.

3. The circuit of claim 2, wherein the main code table outputs the main code corresponding to the operation signal among the main codes.

4. The circuit of claim 1, wherein the trimming code table stores a variety of trimming codes used to correct the main voltage.

5. The circuit of claim 1, wherein the code determination module stores output codes corresponding respectively to available output voltages for the operation voltage generator.

6. The circuit of claim 5, wherein,
   when the trimming code coincides with one of the output codes, the code determination module outputs the main code and the trimming code; and
   when the trimming code does not coincide with any one of the output codes, the code determination module outputs the main code and a most-significant output code as the output code, among the output codes.

7. A memory system comprising:
   a memory device; and
   a controller suitable for controlling the memory device,
   wherein the memory device comprises:
   memory blocks suitable for storing data;
   a voltage generation circuit suitable for generating an operation voltage based on an operation signal; and
   a control circuit suitable for generating the operation signal to control the voltage generation circuit based on a command,
   wherein, when a trimming code is determined to be valid, the voltage generation circuit generates the operation voltage based on a main code and the trimming code, and when the trimming code is determined to be invalid, the voltage generation circuit generates the operation voltage based on the main code and a substitute code.

8. The memory system of claim 7, wherein the voltage generation circuit comprises:
   a main code table suitable for outputting the main code based on the operation signal;
   a main voltage generator suitable for generating a main voltage corresponding to the main code;
   a trimming module suitable for comparing the main voltage with a target voltage to output a trimming signal;
   a trimming code table suitable for outputting the trimming code corresponding to the trimming signal;
   a code determination module suitable for determining whether the trimming code is valid, outputting the main code and a code selected from the trimming code and the substitute code; and
   an operation voltage generator suitable for outputting the operation voltage based on the main code and the selected code.

9. The memory system of claim 8, wherein the main code table stores a variety of main codes.

10. The memory system of claim 8, wherein the trimming code table stores a variety of trimming codes used to correct the main voltage.

11. The memory system of claim 8, wherein the code determination module stores voltage output codes corresponding respectively to available output voltages for the operation voltage generator.

12. The memory system of claim 11, wherein,
    when the trimming code coincides with one of the output codes the code determination module outputs the main code and the trimming code; and
    when the trimming code does not coincide with any one of the output codes, the code determination module outputs the main code and a most-significant output code as the substitute code, among the output codes.

13. The memory system of claim 12, wherein the most-significant output code corresponds to a maximum output voltage among the available output voltages.

14. An operating method of a memory system, the method comprising:
    outputting a main code based on an operation signal;
    generating a main voltage corresponding to the main code;
    comparing the main voltage with a target voltage to output a trimming signal;
    outputting a trimming code corresponding to the trimming signal;
    determining whether the trimming code is valid;
    outputting the main code and the trimming code when the trimming code is determined to be valid, and outputting the main code and a substitute code corresponding to the trimming code when the trimming code is determined to be invalid; and
    outputting an operation voltage based on the main code and a code selected from the trimming code and the substitute code.

15. The method of claim 14, wherein,
    when the trimming code coincides with one of output codes, the trimming code is selected to be outputted; and
    when the trimming code does not coincide with any one of the output codes, a most-significant output code is selected to be outputted among the output codes.

16. The method of claim 15, wherein the most-significant output code corresponds to a maximum trimming voltage among available output voltages to which the output codes correspond respectively.

* * * * *